United States Patent [19]

Aigo

[11] 4,361,163

[45] Nov. 30, 1982

[54] APPARATUS FOR WASHING SEMICONDUCTOR MATERIALS

[76] Inventor: Seiichiro Aigo, 3-15-13 Negishi, Daito-ku, Tokyo, Japan

[21] Appl. No.: 222,212

[22] Filed: Jan. 2, 1981

[51] Int. Cl.³ ............................................. B08B 3/02
[52] U.S. Cl. .................................... 134/199; 134/164
[58] Field of Search ..................... 134/164, 184, 199

[56] References Cited

U.S. PATENT DOCUMENTS

| | | | |
|---|---|---|---|
| 2,596,653 | 5/1952 | Clague et al. | 134/199 |
| 3,215,152 | 11/1965 | Beerli | 134/199 |
| 3,893,869 | 7/1975 | Mayer et al. | 134/184 X |
| 4,092,176 | 5/1978 | Kozai et al. | 134/199 X |
| 4,295,730 | 10/1981 | Fraser | 134/199 X |

FOREIGN PATENT DOCUMENTS 1503888  5/1969  Fed. Rep. of Germany ...... 134/184

*Primary Examiner*—Robert L. Bleutge
*Attorney, Agent, or Firm*—McGlew and Tuttle

[57] ABSTRACT

An improved apparatus for washing semiconductor materials is provided, which comprises any type of washing container in which a predetermined number of semiconductor materials held in a carrier are washed with pure water, and one or a plurality of shower devices mounted above said washing container to thereby wash the semiconductor materials held in a carrier with new pure water when the semiconductor materials are being lifted up.

5 Claims, 3 Drawing Figures

APPARATUS FOR WASHING SEMICONDUCTOR MATERIALS

FIELD OF THE INVENTION

This invention relates to an apparatus for washing semiconductor materials which comprises any type of washing container to wash, with pure water, semiconductor materials past chemical treatment processes.

BACKGROUND OF THE INVENTION

In commonly accepted techniques, this kind of washing apparatus includes any type of washing container such as shower type, cascade type, overflow type, static type, etc., and employs pure water of 10, 15, or other megohm to wash semiconductor materials. For example, a cascade system includes a plurality of washing containers set in a row in order to wash a predetermined number of semiconductor materials such as silicon wafers, glass masks or the like held in a carrier. In such a cascade system, semiconductor materials in a carrier are firstly dipped in an end downstream washing container including lowly pure water and then moved successively into next upstream washing container including comparatively highly pure water, finally into the most upstream washing container in which the semiconductor materials are washed with pure water of the highest purity, and leave the washing process so as to get the next process. In this system, new pure water is introduced into the final washing container for carrying out a final washing. However, the pure water contained in the final washing container includes even a very small quantity of chemical agents or foreign substances resulted from the final washing, so that said pure water can not be maintained at the same purity as new pure water. Also, in case of a shower container type, it includes one washing container in which pure water is poured in and out repeatedly in several times for washing semiconductor materials. Accordingly, the final washing is performed with highly pure water, but it is apparent that even this highly pure water is not of the same purity as the new pure water.

Thus, in a washing process of such prior art washing apparatus, washed semiconductor materials may be attached with any chemical agents or foreign substances, so that these washed semiconductor materials will lower the productivity. In other words, even a very small quantity of chemical agents or foreign substances attached to semiconductor materials permeates into these semiconductor materials and thus results in any noises and lowered electric characteristics.

Therefore, an object of the present invention is to provide an improved washing apparatus in which any chemical agents and foreign substances are not attached to the washed semiconductor materials after the final washing.

To attain the above described object, an apparatus for washing semiconductor materials according to the present invention is characterized by provision of one or a plurality of shower devices mounted above the washing container provided in said apparatus, to thereby wash semiconcuctor materials, when wet, held in a carrier by said shower device or devices with new pure water when the semiconductor materials are being lifted up.

BRIEF DESCRIPTION OF THE DRAWINGS

In the detailed description of the preferred embodiments of the present invention set forth below, reference is made to the accompanying drawings in which.

DESCRIPTION OF THE PREFERRED EMBODIMENTS

Figure 1:
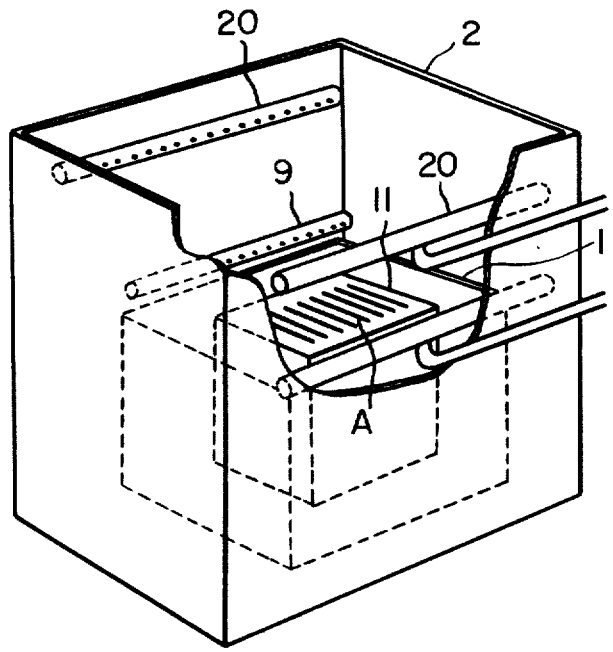
FIG. 1 is a perspective view showing an apparatus for washing semiconductor materials embodied by the present invention in which a portion thereof is out off.
Figure 2:
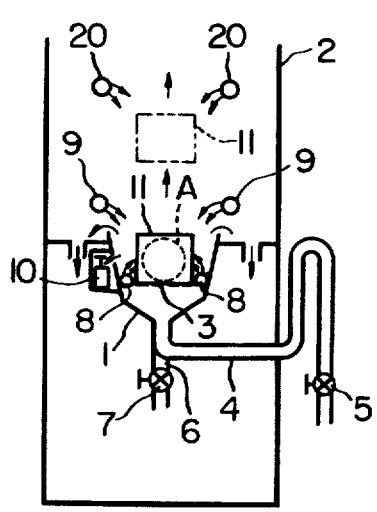
FIG. 2 is a schematic view showing a longitudinal cross section of the apparatus shown in FIG. 1.

Referring now to FIGS. 1 and 2, there is illustrated an embodiment of a washing apparatus which includes a shower type washing container (1). This container (1) is mounted on a predetermined position in a case (2) and is set on a bottom plate (3) made of perforated plate. The lower end of washing container (1) is connected with a siphon type discharge pipe (4), and a valve (5) is disposed at a portion of pipe (4) near the outlet port thereof. Also, bifurcated pipe (6) is provided in position of the discharge pipe (4) and provided with an electromagnetic valve (7). In this embodiment, shower container (1) has a pair of opposed shower nozzles (8) near the bottom thereof and a pair of opposed shower nozzles (9) mounted on upper portion of the container (1). (10) denotes a float switch which is electrically connected with valves (5) and (7) in order to operate them. Further, these container (1), case (2), bottom plate (3) and other members are preferably made of transparent synthetic resin. A predetermined number of semiconductor materials (A) such as wafers to be washed are set in a carrier (11) which is means for receiving materials to be washed, and are supported on bottom plate (3) within the washing container (1).

The feature of the washing apparatus of the present invention is to employ one or a plurality of shower devices (20) in addition to the shower nozzles (8) and (9), to thereby shower-wash the semiconductor materials held in a carrier (11) when the materials are being lifted up. In the apparatus shown in FIG. 1, shower device (20) comprises a pair of shower nozzles or nozzle tubes, in which one shower nozzle (20) is located at one side and the other shower nozzle (20) is located at the opposed side of the case (2). The respective shower nozzles will be of any type, and normally of a pipe formed with a number of small openings.

In operation, this washing apparatus serves to wash, with pure water, semiconductor materials which have past through some chemical treatment processes using etching solution, separation agents or other chemical agents. In this washing process, carrier (11) including therein a set of semiconductor materials is supported on bottom plate (3) as shown in FIG. 2, and then shower nozzles (8) and (9) are operated to wash semiconductor materials wherein the valves (5) and (7) are closed. When washing container (1) is filled with pure water, float switch (10) is energized so as to open either valve (5) or valve (7) to discharge pure water. After that, an opened valve is closed and the container (1) is again filled with pure water, thereafter water in container (1) being likewise discharged. After this process has been repeated preset times, operation of shower nozzles (8) and (9) is stopped and then semiconductor materials with carrier (11) is lifted up. At this time the shower nozzles (20) which are disposed above the shower nozzles (9) discharge new pure water which washes the semiconductor materials held in carrier (11) that is being lifted up.

In the described system, pure water showered from shower nozzles (8) and (9) washes off therein and dissolves any chemical agents such as etching solution and separation agent attached on surfaces of processed semiconductor materials, which results in lowering of purity of the showered pure water. In this respect, float switch (10) operates to repeatedly discharge pure water filled in washing container (1) so as to obtain step by step higher purity of pure water in washing container (1). Although this repetition of discharge of filled pure water can not provide the same purity of water as new pure water, which brought the described disadvantages of prior arts, the washing apparatus of the present invention performs the final washing with completely pure water by means of shower device or devices (20) so that any chemical agents or foreign substances can not be attached to the washed semiconductor materials.

Figure 3:
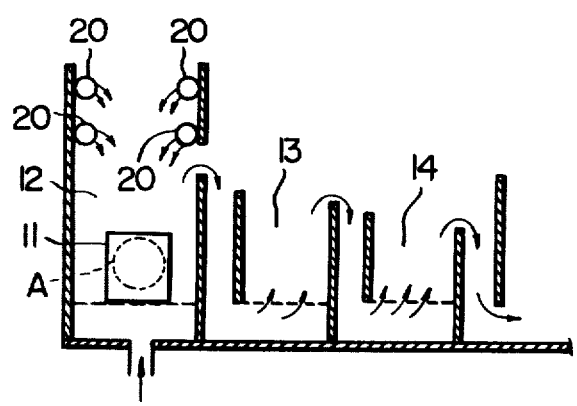
FIG. 3 is a schematic longitudinal cross sectional view showing another embodiment.

As for the above described embodiment including a shower container as washing container (1), it is preferable because of effective washing by both showering and dipping, which enables an efficient washing in a comparatively short time. However, the washing container (1) is not restricted to a shower container, and thus will be of any other type of washing container. For example, as the container (1), a cascade type container as shown in FIG. 3 will be employed. In an embodiment shown in FIG. 3, because new pure water is introduced into the bottom portion of the most upstream container (12), pure water within the container (12) is of the highest purity. Water within the container (12) is overflown into the next container (13), and water within the container (13) is in turn overflown into the next downstream container (14). Thus, purity of pure water is gradually lowered in the downstream direction. In this system, the shower device or devices (20) are disposed above the most upstream washing container (12). Semiconductor materials held in a carrier (11) is firstly dipped into container (14) and moved to the next upstream container (13) and dipped therein, and thereafter moved to the most upstream container (12) and dipped likewise therein. And, when the materials are being lifted up from the container (12), they are shower-washed with new pure water through shower devices (20). Shower devices (20) will be consisted of a plurality of steps and this second embodiment uses two steps of shower devices (20).

As described in these embodiments of the present invention, because semiconductor materials washed in washing container are finally shower-washed with new pure water, when wet, when they are being lifted up from the washing container, no chemical agents or no foreign substances are attached on surfaces of washed semiconductor materials. Therefore, the apparatus according to the invention provides an excellent washing for semiconductor materials. And this contributes to effect considerable improvements in characteristics of semiconductor products.

The present invention may be embodied in other forms or carried out in other ways without departing from the spirit or essential characteristics thereof. The present embodiments are therefore to be considered as in all respects illustrative and not restrictive, the scope of the invention being indicated by the appended claims, and all changes which come within the meaning and range of equivalency are intended to be embraced therein.

I CLAIM:

1. A washing device, particularly for washing articles such as processed semiconductor materials, comprising an outer case, a shallow washing container mounted in said outer case and having a bottom with a drain, a perforated carrier support plate mounted in said shallow washing container above said bottom so as to drain liquid through the perforations of said bottom and through said drain, the carrier container for articles to be washed positioned on said plate and being opened to expose the articles, a first set of shower tubes located at respective sides of said container over said plate and directing a shower spray inwardly against the articles in said carrier container, at least one second set of shower nozzle tubes located above said carrier container and directing a shower stream therebetween and in a direction toward said shower container.

2. A washing device according to claim 1, wherein said at least one set of shower nozzle tubes includes a first set mounted in said case directly over the top of said shower washing container and a second set mounted in said case at a location spaced above said first set and positioned to contact the carrier container as it is being lifted from said case.

3. A washing device according to claim 1, wherein said drain includes a siphon type discharge plate connected into the bottom of said shower washing container.

4. A washing device according to claim 3, wherein said washing container includes a plurality of compartments arranged side by side in a row and with an over flow wall separaring said compartment arranged at successfuly lower heights proceeding from a first compartment toward the last so that one compartment drains fresh water from the first compartment into the next, etc.

5. A washing device according to claim 1, wherein said at least one second set of shower nozzle tubes is mounted directly in said shower washing container above the articles.

* * * * *